(12) United States Patent
Gonzalez Diaz et al.

(10) Patent No.: US 11,353,494 B2
(45) Date of Patent: Jun. 7, 2022

(54) HIGH-SIDE GATE OVER-VOLTAGE STRESS TESTING

(71) Applicant: Texas Instruments Incorporated, Dallas, TX (US)

(72) Inventors: Sigfredo E. Gonzalez Diaz, Allen, TX (US); Benjamin Lee Amey, Allen, TX (US); Patrick Michael Teterud, Plano, TX (US); Hung Nguyen, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 37 days.

(21) Appl. No.: 16/792,671

(22) Filed: Feb. 17, 2020

(65) Prior Publication Data

US 2020/0182925 A1 Jun. 11, 2020

Related U.S. Application Data

(62) Division of application No. 15/389,443, filed on Dec. 22, 2016, now Pat. No. 10,613,134.

(51) Int. Cl.
*G01R 31/26* (2020.01)

(52) U.S. Cl.
CPC ................ *G01R 31/2623* (2013.01)

(58) Field of Classification Search
CPC ............ G01R 31/2621; G01R 31/2628; G01R 31/2623

USPC .................................................... 324/762.09
See application file for complete search history.

(56) References Cited

U.S. PATENT DOCUMENTS

| 5,068,599 | A | * | 11/1991 | Niehaus | G01R 31/2884 |
| | | | | | 324/537 |
| 5,648,920 | A | * | 7/1997 | Duvvury | G06F 30/367 |
| | | | | | 716/50 |
| 6,864,702 | B1 | * | 3/2005 | Teggatz | G01R 31/2858 |
| | | | | | 324/762.09 |
| 7,719,806 | B1 | | 5/2010 | Boyd | |
| 2007/0109064 | A1 | | 5/2007 | Micko | |
| 2008/0079476 | A1 | | 4/2008 | Vice | |
| 2010/0123483 | A1 | | 5/2010 | Chung | |
| 2014/0253218 | A1 | | 9/2014 | Dix | |
| 2015/0326217 | A1 | | 11/2015 | Barranscheen | |
| 2019/0101591 | A1 | * | 4/2019 | Holtz | G01R 1/0735 |

* cited by examiner

*Primary Examiner* — Tung X Nguyen
*Assistant Examiner* — Robert P Alejnikov, Jr.
(74) *Attorney, Agent, or Firm* — Valerie M. Davis; Charles A. Brill; Frank D. Cimino

(57) ABSTRACT

A testing system includes: a substrate having a probe pad and having a supply input; driver circuitry having a driver output; a transistor having a gate, a source, and a drain; and a field effect transistor (FET) engager. The gate of the transistor is coupled to the driver output, and the drain of the transistor is coupled to the supply input. The FET engager is configured to couple the probe pad to the gate of the transistor and provide test instrument measurement of gate current of the transistor without test instrument probe capacitance impacting operation of the transistor.

15 Claims, 2 Drawing Sheets

HIGH-SIDE GATE OVER-VOLTAGE STRESS TESTING

This application is a divisional of prior application Ser. No. 15/389,443, filed Dec. 22, 2016, currently pending.

BACKGROUND

Integrated circuits are used in a variety of applications including cost-sensitive and safety-related applications. To help ensure safety and reduce failures of parts, stress testing of integrated circuits is often performed. Such testing includes methods such as applying a test probe directly to a pad of the integrated circuit under test. However, the introduction of the test probe to circuitry on the integrated circuits can affect the performance of the test, which in turn can reduce the confidence level in the test being performed.

SUMMARY

The problems noted above can be addressed in a testing circuit/system and method for high side gate over-voltage stress testing. A field effect transistor (FET) engager, for example, includes circuits and methods for electrically coupling a gate driver to a gate of a FET for testing the FET. The FET engager further includes providing a probe pad for test instrument measurement of the FET without test instrument capacitance impacting operation of the FET. The FET engager can electrically couple to the gate of the FET hold the gate of the FET at a low voltage while the source and drains are stress tested. The FET engager provides fail-safe mechanisms against accidental turn-on of the FET during operation. The FET engager can provide a second probe pad for selective test instrument turn-on of a second FET. The FET engager can allow test instrument measurement of gate current of the FET without test instrument capacitance impacting operation of the FET.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion.

Figure 1:
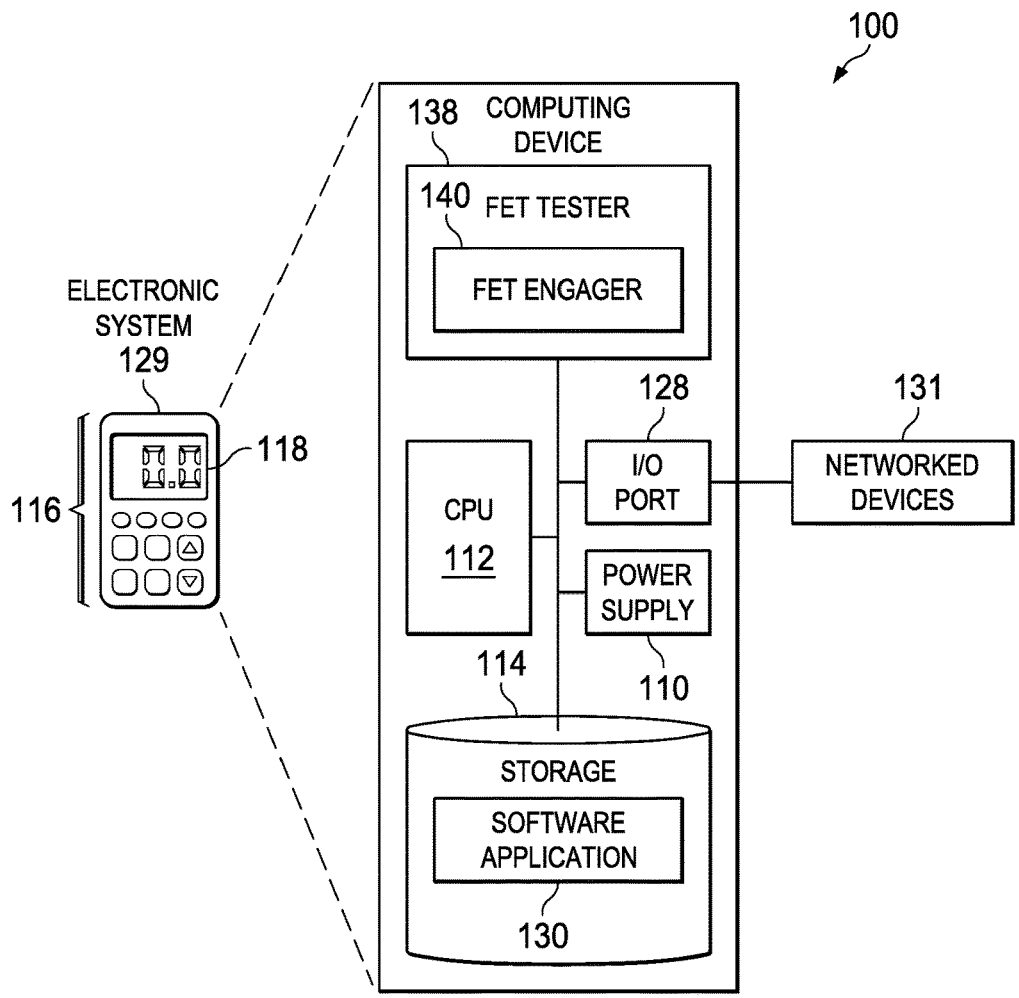
FIG. 1 shows an illustrative electronic device in accordance with example embodiments of the disclosure.

FIG. 1 shows an illustrative computing device 100 in accordance with preferred embodiments of the disclosure. For example, the computing device 100 is, or is incorporated into, an electronic system 129, such as a computer, electronics control "box" or module, robotics equipment (including fixed or mobile), automobiles or any other type of system where a computer controls physical devices and/or processes information.

In some embodiments, the computing device 100 comprises a megacell or a system-on-chip (SoC) which includes control logic components such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The CPU 112 includes functionality provided by discrete logic components and/or is arranged to execute application-specific instructions (e.g., software or firmware) that, when executed by the CPU 112, transform the CPU 112 into a special-purpose machine. The notional line of "division" between hardware and software is a design choice that (e.g., selectively) varies depending on various tradeoffs including cost, power dissipation, reliability, time to market, and the like. Accordingly, the functionality of any software used to control one or more CPUs 112 of the computing system 100 can be entirely embodied as hardware (e.g., when given sufficient time and resources for design and manufacture).

The storage 114 (which can be memory such as on-processor cache, off-processor cache, RAM, flash memory, data registers, flip-flops, disk storage, and the like) stores one or more software applications 130 (e.g., embedded applications) that, when executed by the CPU 112, transform the computing device 100 into a special-purpose machine suitable for performing a targeted function such as involved with field effect transistor (FET) testing.

The CPU 112 comprises memory and logic that store information frequently accessed (e.g., written to and/or read from) from the storage 114. The computing device 100 is often controlled by a user using a UI (user interface) 116, which provides output to and receives input from the user during the execution the software application 130. The output is provided using the display 118, which includes annunciators (such as indicator lights, speakers, vibrators, and the like) and controllers. The input is received using audio and/or video inputs (using, for example, voice or image recognition), and electrical and/or mechanical devices (such as keypads, switches, proximity detectors, gyros, accelerometers, testers, and the like).

The CPU 112 is coupled to I/O (Input-Output) port 128, which provides an interface that is configured to receive input from (and/or provide output to) networked devices 131. The networked devices 131 can include any device (including "Bluetooth" units that are electronically paired with the computing device 100) capable of point-to-point and/or networked communications with the computing device 100. The computing device 100 is optionally coupled to peripherals and/or computing devices, including tangible, non-transitory media (such as flash memory) and/or cabled or wireless media. These and other input and output devices are selectively coupled to the computing device 100 by external devices using wireless or cabled connections. The storage 114 is accessible, for example, by the networked devices 131. The CPU 112, storage 114, and power supply 110 can be coupled to an external power supply (not shown) or coupled to a local power source (such as a battery, solar cell, alternator, inductive field, fuel cell, capacitor, and the like).

The computing system 100 includes a FET tester 138 arranged to allow accelerated stress testing of FET gate oxides using OVST (over-voltage stress test) methods. The OVST methods are often used in testing of high-side (HS) power FETs used in switching power supplies. The FET tester 138 performs OVST without having to rely on direct probing strategies not requiring probe pad placement on the gate of an HS FET. Accordingly, problems can be avoided such as problems due to large capacitance induced by test instrumentation connected to a probe pad.

The FET tester 138 includes a FET engager 140 circuit for holding the gate of an HS FET under-test to a low logic level during an OVST (which turns the HS FET off). While the gate of the HS FET is held low, the source terminal of the main HS FET is forced to a high voltage, which applies the over-voltage for the stress test. The FET engager 140 is arranged, for example, such that the FET engager 140 does not require a (e.g., highly capacitive) probe pad to be directly coupled to the gate of the HS FET. Accordingly, the FET tester 138 is arranged, for example, to allow the gate current of the HS FET to be measured without test probe and test instrument probe of capacitance adversely impacting of the HS FET being tested.

The OVST methods (often including the accelerated stress testing) are performed to help achieve a low defective parts per million (DPPM) rates for automotive and other high-reliability designs. For some circuit types, the OVST testing can use a direct probing strategy. However, in other circuit configurations (such as for designs incorporating HS FETs in a switched-mode power supply), direct probing may not be suitable. As described below with reference to FIG. 2, direct OVST probing of HS FETs to-be-tested includes placing a probe pad on the HS FET gate. In the course of such direct probe testing, problems can arise during probe testing due to large capacitances introduced by test instrumentation coupled to the probe pad.

Figure 2:
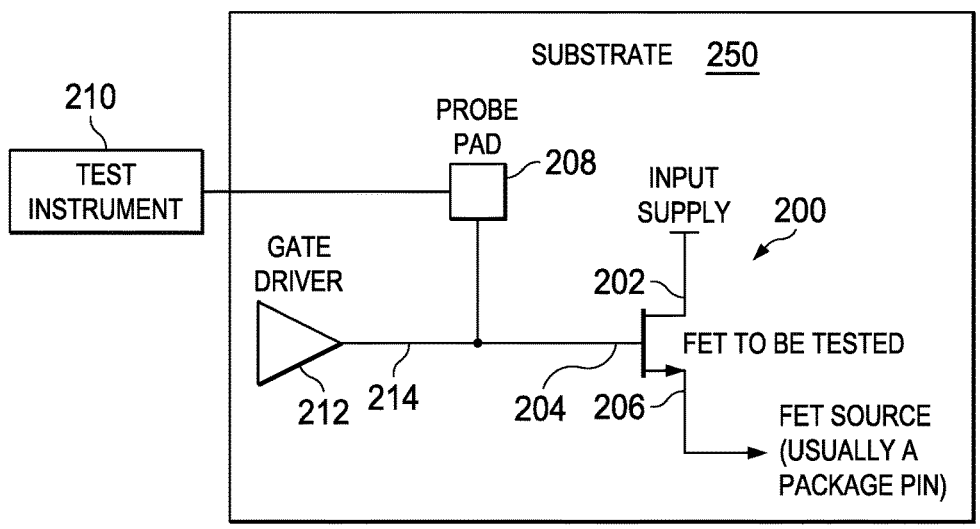
FIG. 2 is a schematic diagram of on-substrate test circuitry for direct probing of the gate of an FET to be tested.

FIG. 2 is a schematic diagram of on-substrate test circuitry for direct probing of the gate of an FET (e.g., 200) to be tested. Substrate 250 includes the FET 200, and a probe pad 208, and a gate driver 212 for testing the FET 200. The FET 200 includes a drain 202, a gate 204, and a source 206, where the FET 200 is operable to be tested by direct probing of the gate 204 of the FET 200. The probe pad 208 is electrically coupled (e.g., by a conductive "net") to the gate 204, where the probe pad 208 is operable to electrically contact probe of the test instrument 210. The output 214 of gate driver 212 is also electrically coupled to gate 204 of FET 200 (such that, for example, the state of the FET 200 is controlled by the gate driver 212). The gate driver 212 is optionally a linear amplifier in applications where the FET 200 being tested is included in a linear regulator application. In other applications, gate drive 212 is optionally a high-speed gate driver when the FET 200 is included in (for example) a switched mode power supply application.

In operation, the gate 204 of FET 200 is driven by gate driver 212 and a probe of test instrument 210 is applied to probe pad 208 for measuring consequential effects of the OVST test methods. In an example OSVT method implemented in accordance with FIG. 2, the gate of the FET to be tested is successively driven high and low to establish an inversion layer (e.g., channel) connecting the drain 202 and source 206 of the FET 200. The drain 202 is coupled to an input supply voltage (e.g., VCC and/or normal supply voltage). An overvoltage is coupled to the source 206 (e.g., via an off-substrate 250 package pin) to establish a selected voltage delta between gate and source for stress testing the gate 204.

Accordingly, in a test mode, the source 206 is driven higher than an input supply voltage coupled to the drain 202. The effect of the stress testing can be measured by applying a tip of the probe of the test instrument 210 to the probe pad 208 (e.g., to measure resulting voltages on the gate 204).

However, applying the tip of the probe of the test instrument 210 to the probe pad 208 increases the capacitance of the net coupled to the gate 204 (which affects electrical characteristics such as frequency response of the transistor under test). The increased capacitance affects the associated regulation loop in linear (e.g., low-dropout regulation) applications (e.g., such that the stability of the feedback loop is no longer the same, which impeaches test results). The increased capacitance affects also affects the operation of the FET 200 in switching applications, where the gate driver 212 is unable to drive the extra capacitance (e.g., at higher frequencies) such that the gate 204 is no longer able to switch the FET on and off (e.g., but for the presence of the capacitance associated with the tip of the test probe and/or the capacitance associated with the probe pad 208 itself).

Figure 3:
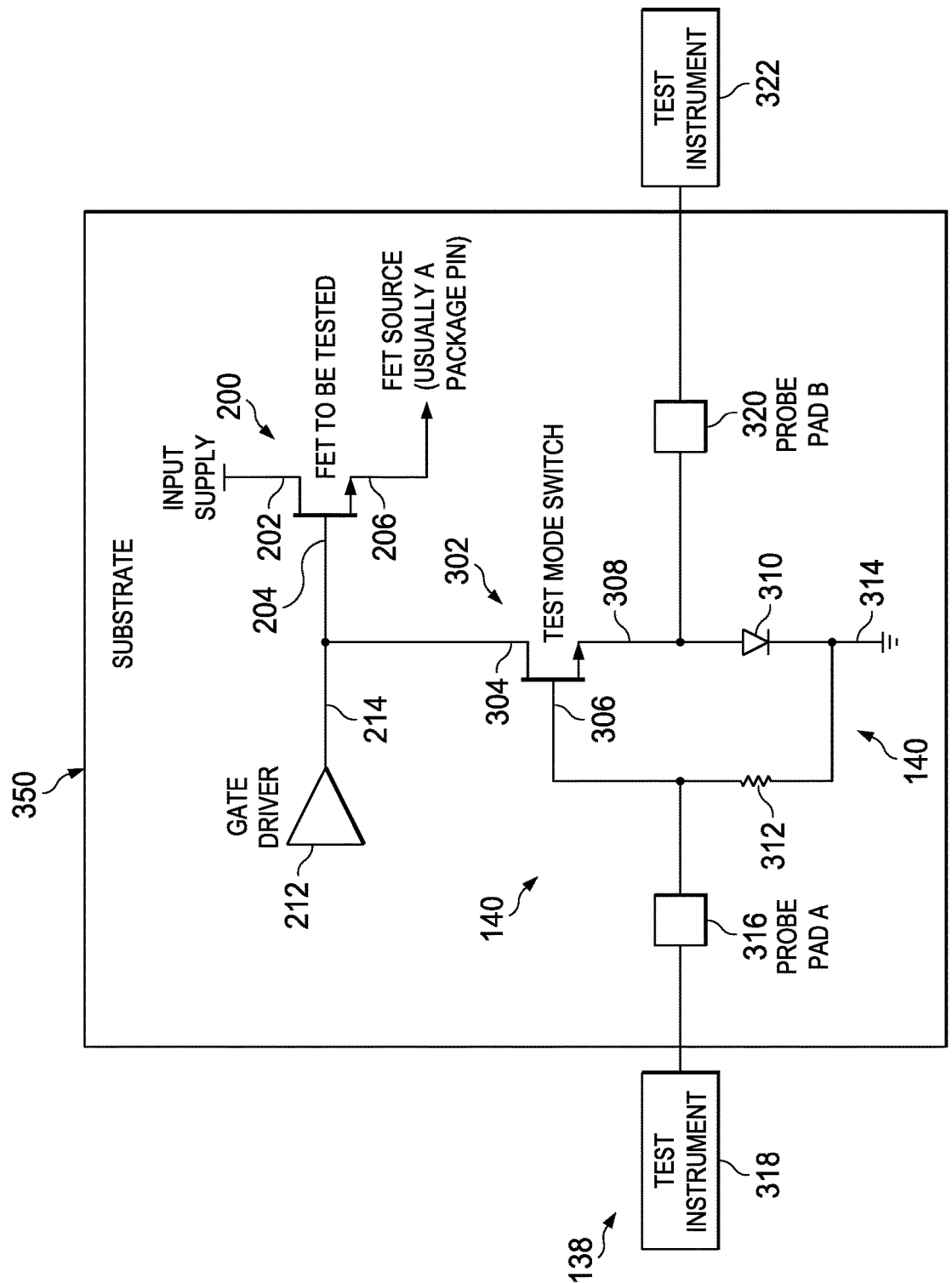
FIG. 3 is a schematic diagram of on-substrate test circuitry for indirect probing of the gate of an FET to be tested in accordance with embodiments of the present disclosure.

FIG. 3 is a schematic diagram of on-substrate test circuitry for indirect probing of the gate of an FET to be tested in accordance with embodiments of the present disclosure. In FIG. 3, the substrate 350 includes (e.g., disposed and/or arranged thereupon) the to-be-tested FET 200, where the gate 204 of to-be-tested FET 200 is arranged to be driven by gate driver 212.

The substrate 305 also includes a disclosed test mode switch 302 for isolating the gate of the to-be-tested FET 200 from capacitance sourced by the tip of the probe of a test instrument (e.g, 318 or 322). As disclosed herein, the drain 304 of FET 302 is electrically coupled to gate 204 of FET 200, the gate 306 of FET 302 is electrically coupled to a probe pad "A" (316) and is also electrically coupled to ground (via a resistor 312), and the source 308 of FET 302 is electrically coupled to a system ground 314 (via a diode 310) and is also electrically coupled to a probe pad "B" (320).

Accordingly, a tip of the probe of the test instrument 318 can be applied to (e.g., made to physically and/or electrically contact) the probe pad 316, and a tip of the probe of the test instrument 322 can be applied to (e.g., made to physically and/or electrically contact) the probe pad 320. The probe pad 316 is arranged on the substrate 305 and is operable for coupling (e.g., receiving) a voltage from off of the substrate 305 for turning on the FET 302, whereas the probe pad 320 is operable for coupling (e.g., sourcing) a current for measurement by a current measurement test instrument.

In operation, aspects of an OVST method can be implemented in accordance with FIG. 3 through at least including (but not limited) to: 1) Pulling probe pad A (316) high (e.g., by application of a voltage provided by test instrument 318), which turns on FET 302 (e.g., as a test mode switch); 2) Applying a test probe of test instrument 322 (e.g., for voltage and/or current measurement) to probe pad B (320); 3) Forcing the source-to-drain voltage of power FET 200 up to a selected stress voltage (e.g., by applying a selected voltage to the source of 206 of the under-test FET 200 via a package pin of a package including substrate 350); 4) Gate current sourced by under-test FET 200 (if any, e.g., due to gate damage) can be detected and measured by test instrument 322 via probe pad B 320; and 5) Maintaining the voltage developed at the source 308 of the test mode switch at a level at least a diode 310 voltage "drop" above the system ground 314, so that (for example) ground current is not measured (e.g., by performing measurements at voltages substantially above the system ground 314 and an associated noise floor).

A diode 310 is disposed in series between the second probe pad and the ground 314. The diode 310 is operable to maintain a voltage of the source of the test mode switch FET 302 at a diode threshold above a system ground when the test mode switch FET 302 is turned on. Further, the diode 310 is operable to prevent the voltage of the source of the test mode switch FET 302 from exceeding the diode threshold when the test mode switch FET 302 is turned off.

Accordingly, the to-be-tested FET 200 is operable to be turned off in response to a voltage supplied by an on-substrate gate driver 212, and the second FET is operable to be turned on in response to an off-substrate driver (such as test instrument 318).

Gate current (e.g., due to failure of the associated gate oxide) can be incurred by leakage of current across the gate oxide in response to an overvoltage provided as a source-to-drain voltage. The extra current (e.g., is not affected by the high impedance output of the gate driver 212) is selectively (e.g., when the test mode switch 302 is turned on) coupled to the anode of diode 310 (as well as the probe pad B).

The current output from the gate driver 212 (e.g., which is not normally affected by the high impedance gate 204) is also selectively coupled to the anode of diode 310 as well as the probe pad B. The sum of both such currents in the absence of a path to ground 314 via probe pad B are carried through diode 310, which maintains a voltage a diode-threshold above ground 314. In normal operation the sum of the currents is only the gate driver current, which can be measured via probe pad B. Accordingly, the diode 310 is operable to maintain a voltage of the source of the second FET at a diode threshold above a system ground 314 when the second FET is turned on, and the diode 310 is operable to prevent the voltage of the source of the second FET from exceeding the diode threshold when the second FET is turned off.

As a particular OSVT method selectively applies successively higher source-to-drain voltages, the gate oxide of the under-test FET can fail, which injects gate current from gate 204 into the source of the test mode switch. The injected gate current can be detected by subtracting a present (e.g., current resulting from a selected applied voltage) current measurement from a reference (e.g., normal current sourced by the gate driver) current, where the difference of the present (e.g., overvoltage-induced) current and the reference current is the (e.g., failed gate-oxide induced) gate current.

In a "failsafe" embodiment, the pulldown resistor 312 is 60 kilo-Ohms and is arranged to passively dissipate capacitively stored (or transferred) charges on the probe pad 316, the tip of the probe of the test instrument 318, nets (e.g., metal traces) coupled to the gate 306, and the gate 306 itself. Dissipation of the stored charge helps prevent, for example, accidental turning on of the test mode switch in normal operation.

In an "on-chip programmed" embodiment, the need for the probe pad A (and test instrument 318) is avoided by selectively activating the test mode switch by on-substrate (e.g., 350) control circuitry such as the CPU 112. However, while reducing the need for external test instruments (such as test instrument 318), additional active components might be needed for avoiding activation of the test circuitry during normal operation.

The disclosed embodiment includes a circuit including, but not limited to, FET 302 (as a switch), diode, resistor 312 (pulldown resistor), and two probe pads (probe pad A 316 and probe pad B 320). The disclosed circuit is arranged to drive and hold the gate 204 low during OVST methods while (e.g., at the same time) the source 206 of the (e.g., high-side) FET 200 is forced to a high voltage. The disclosed circuit does not require a (e.g., relatively highly capacitive) probe pad to be capacitively coupled to the gate 204 of the FET 200 and provides an (e.g., measurable) indication (e.g., at the anode of diode 310) for indicating the gate current of HS FET 200 (which is sourced in failure condition of the gate oxide of the gate of the first FET).

The implementation can help provide a fail-safe against accidental turning-on of the test mode switch-related circuitry during normal operation, for example, by designing by the use of passive components (e.g., the pulldown resistor) for ensuring a default condition of being disabled. Further, the diode 310 included in the embodiment can allow direct current measurement while also protecting the source 308 node (e.g., including structures capacitively coupled to the source 308) of the 308 of FET 302 (e.g., the OVST test mode switch) from floating up (e.g., having a raised voltage while the test mode switch 302 is turned off) during normal operation. Accordingly, the disclosed embodiment is arranged, for example, to perform OVST methods and current measurement of gate 204 while obviating the need for a (relatively) highly-capacitive pad on gate 204 of FET 200 (which can adversely affect test results for either or both linear or switching applications.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:
1. A testing system comprising:
   a substrate having a probe pad and having a supply input;
   driver circuitry having a driver output;
   a transistor having a gate coupled to the driver output, having a source, and having a drain coupled to the supply input;
   a field effect transistor engager configured to couple the probe pad to the gate of the transistor and provide test instrument probe measurement of gate current from the transistor without test instrument probe capacitance affecting operation of the transistor.

2. The testing system of claim 1 in which the field effect transistor engager is configured selectively to couple the probe pad to the gate of the transistor in a test mode.

3. The testing system of claim 1 in which the field effect transistor engager is configured selectively to couple the probe pad to the gate of the transistor in a test mode and to selectively uncouple the probe pad from the gate of the transistor in normal operation.

4. The testing system of claim 1 in which the field effect transistor engager is configured to provide a fail-safe against accidental turn-on during normal operation.

5. The testing system of claim 1 in which the probe pad is a first probe pad, and the substrate having a second probe pad configured for a test instrument to turn on the field effect transistor engager in response to an external voltage applied to the second probe pad.

6. The testing system of claim 5 including a test instrument coupled to the second probe pad.

7. The testing system of claim 5 including a first test instrument coupled to the first probe pad and a second test instrument coupled to the second probe pad.

8. The testing system of claim 1 in which the field effect transistor engager is configured to couple the probe pad to the gate of transistor and provide test instrument probe measurement of gate current from the transistor without test instrument probe capacitance affecting operation of the transistor when forcing a source-to-drain voltage of the transistor up to a selected stress voltage.

9. The testing system of claim 1 in which the transistor is a first transistor, and the field effect transistor engager includes a second transistor coupled to the first transistor, and in which the field effect transistor engager is configured to provide an indication of gate current of the first transistor without test instrument capacitance impacting operation of the first transistor in a normal mode of operation different from a test mode in which the second transistor is configured to provide the indication of gate current of the first transistor.

10. The testing system of claim 1 in which the driver circuitry, the transistor, and the field effect transistor engager are formed on the substrate.

11. The testing system of claim 1 in which the transistor and the field effect transistor engager are N-type metal-oxide semiconductor transistors.

12. The testing system of claim 1 including a diode having a cathode coupled to a system ground and having an anode coupled to the source of the field effect transistor engager.

13. The testing system of claim 1 in which the field effect transistor engager has a gate and including a resistor coupled between a system ground and the gate of the field effect transistor engager.

14. The testing system of claim 1 in which the source of the transistor is coupled to a package pin.

15. The testing system of claim 1 including a test instrument coupled to the probe bond pad.

* * * * *